(12) United States Patent
Bicknell et al.

(10) Patent No.: US 7,627,013 B2
(45) Date of Patent: Dec. 1, 2009

(54) LIGHT SOURCE MODULE

(75) Inventors: Robert N. Bicknell, Corvallis, OR (US); Paul Benning, Corvallis, OR (US); Alexander Govyadinov, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/347,183

(22) Filed: Feb. 3, 2006

(65) Prior Publication Data

US 2007/0183473 A1 Aug. 9, 2007

(51) Int. Cl.
*H01S 5/00* (2006.01)
(52) U.S. Cl. ............... 372/50.121; 372/50.12; 372/92; 372/99; 372/102
(58) Field of Classification Search ............... 372/96, 372/98, 102, 50.12, 50.121, 92, 99
See application file for complete search history.

(56) References Cited

U.S. PATENT DOCUMENTS

| | | | | |
|---|---|---|---|---|
| 5,521,748 | A * | 5/1996 | Sarraf | 359/321 |
| 5,745,153 | A * | 4/1998 | Kessler et al. | 347/241 |
| 6,016,210 | A | 1/2000 | Stappaerts | |
| 6,141,465 | A * | 10/2000 | Bischel et al. | 385/4 |
| 6,169,565 | B1 * | 1/2001 | Ramanujan et al. | 347/238 |
| 6,212,310 | B1 * | 4/2001 | Waarts et al. | 385/24 |
| 6,215,598 | B1 * | 4/2001 | Hwu | 359/641 |
| 6,240,116 | B1 * | 5/2001 | Lang et al. | 372/50.12 |
| 7,212,554 | B2 * | 5/2007 | Zucker et al. | 372/29.02 |
| 2002/0196414 | A1 * | 12/2002 | Manni et al. | 353/31 |
| 2003/0133485 | A1 * | 7/2003 | Liu | 372/50 |
| 2004/0090599 | A1 * | 5/2004 | Kowarz et al. | 353/31 |
| 2005/0018743 | A1 * | 1/2005 | Volodin et al. | 372/102 |
| 2005/0207466 | A1 | 9/2005 | Glebov et al. | |
| 2006/0023173 | A1 | 2/2006 | Mooradian et al. | |

FOREIGN PATENT DOCUMENTS

| | | |
|---|---|---|
| EP | 1411732 A2 | 4/2004 |
| EP | 1522885 A1 | 4/2005 |
| WO | WO 95/08206 A | 3/1995 |
| WO | WO 01/48882 A | 7/2001 |
| WO | WO 02/05038 A3 | 1/2002 |
| WO | WO 2006/045303 A | 5/2006 |

OTHER PUBLICATIONS

Chen et al "Enhanced Tunability in Chirped Grating DFB Lasers" Department of Electronic Engineering , University of Tokyo.*
Ishii et al "Surface-relief type Bragg grating reflector fabricated after overcladding removal" Electronics Letters vol. 29 No. Sep. 19, 1993.*

(Continued)

*Primary Examiner*—Minsun Harvey
*Assistant Examiner*—Yuanda Zhang

(57) ABSTRACT

A light source module for use in display systems is provided herein. According to one exemplary embodiment, the light source module includes a plurality of coherent light sources, and a diffraction grating in optical communication with the coherent light source, the diffraction grating being configured to provide feedback to the coherent light source to produce a plurality of spectra over a broad spectrum.

13 Claims, 3 Drawing Sheets

OTHER PUBLICATIONS

Stalh et al.; Sheared-Beam Coherent Image Reconstruction; Conference Paper; Aug. 7-9, 1996; 9 pages; Denver, CO; (Abstract Only).

Dingel et al.; Speckle Reduction with Virtual Incoherent Laser Illumination Using a Modified Fiber Array; Journal Article; Sep. 1993; pp. 132-136; v94; Optik (Stuttgart); (Abstract Only).

Ikeda, O; Combine Two Nonlinear Image Processings for Speckle-Free Imaging with the Optical Array Imaging System; Jornal; 1996; 29-32; IEEE; New York, NY USA; (Abstract Only).

Daneu et al, "Spectral Beam Combining of a Broad-Stripe Diode Laser Array in an External Cavity", Optics Lettes, V. 25(6), Mar. 15, 2000.

* cited by examiner

LIGHT SOURCE MODULE

BACKGROUND

Display systems display an image or series of images on a display surface. In particular, each image is frequently made up of several sub-images. For example, some systems produce a red, a green, and a blue sub-image that are then combined to form a single, full-color image.

Recent designs have made use of lasers to provide light. Lasers frequently allow for the formation of relatively bright images. Such lasers frequently produce light with relatively high spatial coherence. Light produced by the lasers is frequently scattered by directing the light to a scattering member. Scattering members are often shaped so as to disperse the light over a larger area. The scattering members often have several "scattering centers" from which the incident light is scattered. Such designs frequently make use of several moving parts. Accordingly, such designs can be complicated and expensive.

SUMMARY

A light source module for use in display systems is provided herein. According to one exemplary embodiment, the light source module includes a plurality of coherent light sources, and a diffraction grating in optical communication with the coherent light source, the diffraction grating being configured to provide feedback to the coherent light source to produce a plurality of spectra over a broad spectrum.

BRIEF DESCRIPTION OF THE DRAWINGS

The accompanying drawings illustrate various embodiments of the present apparatus and method and are a part of the specification. The illustrated embodiments are merely examples of the present apparatus and method and do not limit the scope of the disclosure.

Throughout the drawings, identical reference numbers designate similar, but not necessarily identical, elements.

DETAILED DESCRIPTION

A light source module is provided herein for use in display systems. According to one exemplary embodiment, the light source module includes an array of lasers, such as an array of semiconductor lasers. According to one exemplary embodiment, the output of the array of lasers is tuned using a chirped or varied diffraction grating in optical communication with the laser array. The chirped grating provides differing feedback to each individual laser. By selecting the feedback provided to each laser, each laser may be tuned to produce a relatively narrow spectrum of light with a peak at a desired or tuned wavelength. The output of each laser in the array may be selected such that each relatively narrow spectrum may be combined to form broad spectrum light. For example, tens of narrow spectra may be combined to form a single beam of broad spectrum light. Thus, the resulting combined output of the laser array is broad spectrum light with a short coherence length. The relatively short coherence length over the broad spectrum reduces speckle while providing a bright output. The laser array may be readily formed on a single chip or substrate, thereby reducing the complexity associated with forming a light source module.

An exemplary display system will first be discussed, followed by a discussion of a method of modulating light, an exemplary light source module, and a method of forming a light source module.

In the following description, for purposes of explanation, numerous specific details are set forth in order to provide a thorough understanding of the present method and apparatus. It will be apparent, however, to one skilled in the art that the present method and apparatus may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Display System

Figure 1:
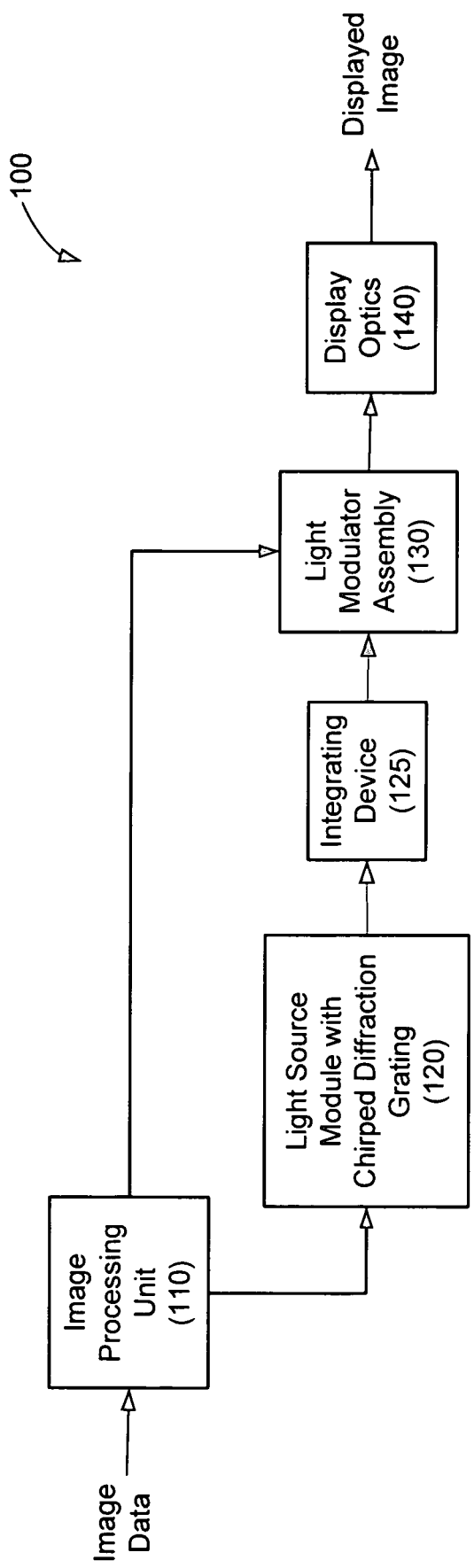
FIG. 1 is a schematic view of a display system according to one exemplary embodiment.

FIG. 1 is a schematic view of a display system (100) according to one exemplary embodiment. The components of FIG. 1 are exemplary only and may be modified or changed as best serves a particular application. As shown in FIG. 1, image data is input into an image processing unit (110). The image data defines an image that is to be displayed by the display system (100).

While one image is illustrated and described as being processed by the image processing unit (110), it will be understood by one skilled in the art that a plurality or series of images may be processed by the image processing unit (110). The image processing unit (110) may perform various functions, including controlling the illumination of a light source module (120) and controlling a light modulator assembly (130).

The light source module (120) includes an array of lasers in optical communication with a chirped or varied diffraction grating in an external cavity configuration. Thus, the diffraction grating is configured to provide feedback to the lasers. The feedback interacts with the laser to tune the spectrum of the light exiting the laser. The diffraction grating is configured such that each laser or group of lasers receives a different selected feedback. Each different selected feedback results in a different output from each laser. Thus, individual lasers or groups of lasers can be tuned to produce light with a selected spectrum. Each spectrum may be relatively narrow as compared to a broad spectrum. For example, each laser may have a spectral width of less than about 1 nm, and the array could have a spectral width of greater than about 30 nm. By properly selecting the output of each laser to correspond to a selected portion of a broad spectrum, the light source module (120) is able to produce individual beams that cover a broad spectrum. These individual beams may then be combined to produce a single beam of broad spectrum light with sufficient spectral width to reduce speckle.

The light from the light source module (120) is then directed to the light modulator assembly (130). For example, according to one exemplary embodiment, the output of the light source module (120) is passed through an integrating device (125). The integrating device (125) spatially homogenizes the light, and directs the light to the light modulator assembly (130). The light incident on the light modulator assembly (130) may be modulated in its phase, intensity, polarization, or direction by the light modulator assembly (130) to form substantially full images or sub-images. The light modulated by the light modulator assembly (130) is then directed to display optics (140).

The display optics (140) may include any device configured to display or project an image. For example, the display optics (140) may be, but are not limited to, a lens configured to project and focus an image onto a display surface. The display surface may be, but is not limited to, a screen, a television such as a rear projection-type television, wall, liquid crystal display (LCD), or computer monitor. An exemplary method of modulating light in a light modulator assembly will now be discussed.

Method of Modulating Light

Figure 2:
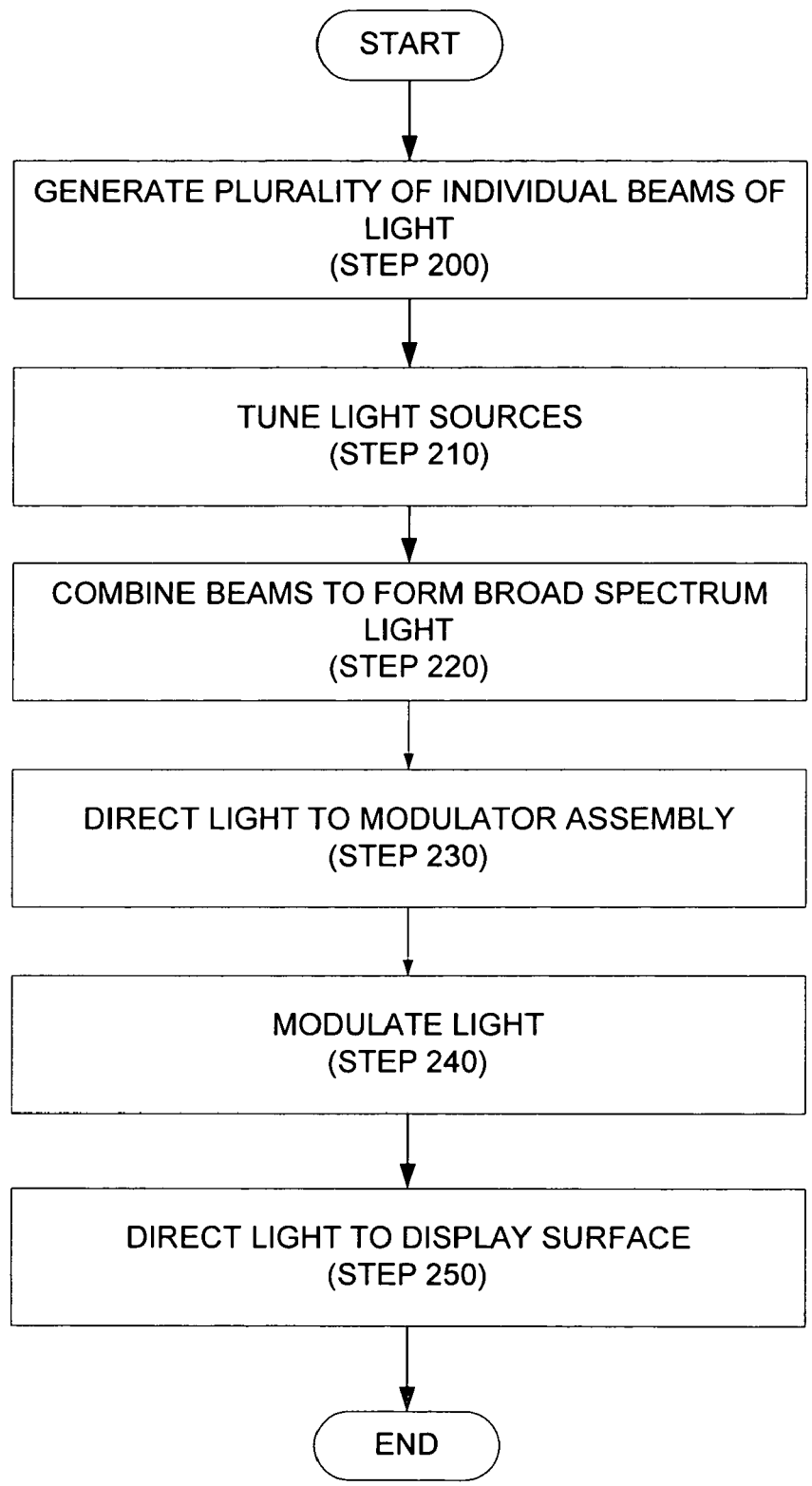
FIG. 2 illustrates a method of modulating light according to one exemplary embodiment.

FIG. 2 is a flowchart illustrating a method of modulating light. The method begins by generating a plurality of individual beams of light (step 200). The light may be of any type of coherent light, including laser light. In particular according to one exemplary embodiment, the light is generated by an array of semiconductor lasers. As will be discussed in more detail below, the laser sources may be configured to initially produce a narrow spectrum of light.

The output of each laser or selected groups of light sources, which corresponds to the individual beams generated, are then tuned (step 210). For example, according to one exemplary embodiment, the output of each laser is incident on a diffraction grating. The final spectrum of each laser is determined by several factors. For ease of reference, the un-tuned output of each laser will be referred to as having an initial spectrum or range of wavelengths while the output of each laser which exits a light source module will be referred to as a final spectrum. In the case of a semiconductor laser, the final wavelength may be determined by a correlation of the initial spectrum, the Fabry-Perot modes of the laser, and the feedback provided by the diffraction grating. If each of the lasers are similar, and thus produce light with a similar initial spectrum, then the final spectrums are determined by the feedback provided by the diffraction grating. The specific operation and tuning of each laser will be discussed in more detail below.

Thus, according to one exemplary embodiment, the diffraction grating associated with each laser is selected to produce a selected spectrum having a peak at a certain wavelength. Diffraction gratings with differing characteristics may be associated with different lasers or groups of lasers to produce multiple spectra. These spectra are then combined to form broad spectrum light (step 220). For example, according to one exemplary embodiment the light may be combined using an integrating device, such as an integrating rod or an integrating tunnel. The integrating device spatially homogenizes and combines the laser light. The combined laser light has a relatively short coherence length, as will be discussed in more detail below.

The combined light is then directed to a light modulator assembly (step 230), such as a light modulator panel or panels. This light is then modulated (step 240) to form a full image or sub-image. The modulated light is then directed along a projection path (step 250) to display an image or sub-image on a display surface. Accordingly, the present method provides for the simultaneous generation of a beam of several individual spectra which are then combined to form a single beam of broad spectrum light.

Light Source Module

Figure 3:
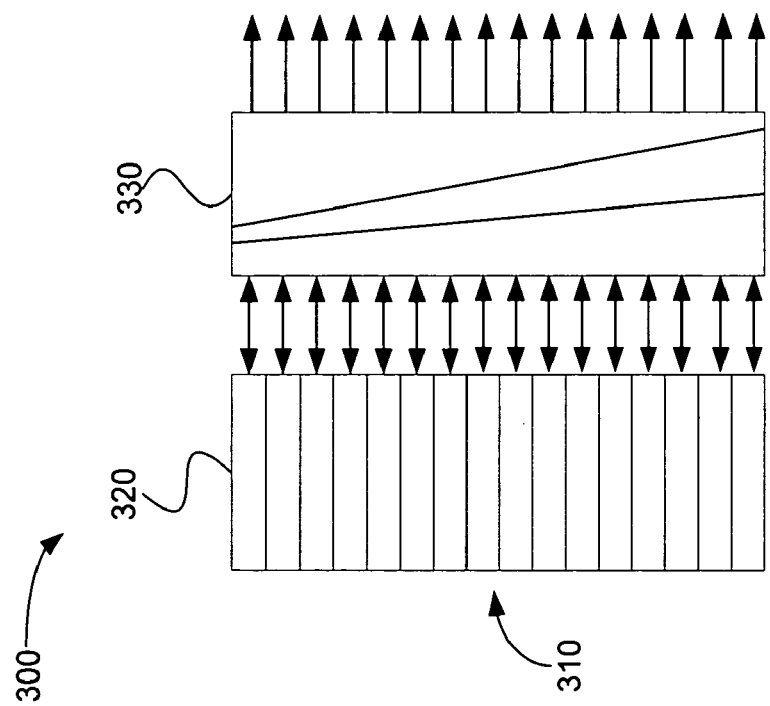
FIG. 3 is a schematic view of a projection light source assembly according to one exemplary embodiment.

FIG. 3 is a schematic view of a light source module (300) according to one exemplary embodiment. The light source module (300) includes an array (310) of individual lasers (320) and a diffraction grating (330). As will be discussed in more detail below, the diffraction grating (330) tunes the output of the array (310) to produce broad spectrum light having a short coherence length relative to the initial spectrum of the individual lasers (320). For ease of reference, a single laser will be discussed with reference to each desired narrow spectrum. Those of skill in the art will appreciate that any number of lasers may be used to produce any number of spectra—for example, it may be desirable to use a group of lasers to produce a selected spectrum.

The lasers (320) may be of any type, such as semiconductor lasers. Suitable semiconductor laser types include, without limitation, VCSEL and/or edge emitting lasers. For ease of reference, an array of edge emitting laser will be discussed. Those of skill in the art will appreciate that other types of lasers may be used.

Each edge emitting laser (320) includes an optical cavity defined therein. The optical cavity functions as a Fabry-Perot resonant cavity. Each cavity is a generally rectangular cavity with highly polished surfaces at the ends. For example, each laser (320) may include cleaved facets formed on each end that act as mirrors. These facets reflect photons back into the active layer of the semiconductor where they interact with excited electrons.

Each edge emitting laser (320) also includes an active portion and a passive portion, located between each of the two ends or facets described above. The active or gain region excites electrons. These excited electrons interact with photons within the resonant cavity. The interaction between the excited electrons and the photons causes the laser (320) to lase, or produce light by stimulated emission.

The cavity is designed to resonate at a frequency corresponding to the energy of the stimulated emission. The light produced by each laser has a gain bandwidth covering a certain spectrum. For example, the gain bandwidth of the laser (320) may be approximately 100 nm. According to one exemplary embodiment, the cleaved facets have a reflectivity of about 30%, which allows some of the light to escape.

The escaping light travels through the space defined between the array (310) and the diffraction grating (330). This space may be generally referred to as an external cavity as compared to the internal or resonant cavities formed in each laser (320). Thus, the light source module according to the present exemplary embodiment is an external cavity feedback type laser light module.

After the light travels through the external cavity, the light is then incident on the diffraction grating (330). When light is incident on the diffraction grating (330), diffractive and mutual interference effects occur. As a result, a portion of the light is reflected and a portion of the light is transmitted. The light which is reflected and the light which is transmitted depends, at least in part, on the characteristics of the diffraction grating. At least a portion of the light that is reflected is directed back to the laser (320).

The light reflected back to the laser (320) modifies or "tunes" the output of that laser. In particular, according to one exemplary embodiment the light re-entering the laser reinforces light in the resonant cavity of the same spectral band. As a result, light within that spectral band within the resonant cavity is preferentially created and released through the cleaved ends. The result is that a relatively narrow spectrum of light of a selected bandwidth is emitted.

According to the exemplary embodiment illustrated, the diffraction grating associated with the top of the array produces a narrow spectrum having a peak near the lower wavelength value of the tunable region of the laser (320). The adjacent laser has a diffraction grating tuned to produce a narrow spectrum with a peak at a slightly longer wavelength.

The following laser in turn is also associated with a diffraction grating which produces a peak with a slightly larger value, and so forth. While a diffraction grating configured to form spectrum with peaks at increasing wavelengths is described, those skilled in the art will appreciate that any configuration of grating is possible to produce several smaller spectra that form part of a broad spectrum of light.

In any case, by properly selecting the characteristics of the diffraction grating, each laser (320) or a selected group of lasers is able to produce light with a desired spectrum along the tunable bandwidth of the lasers. The diffraction grating may be of any type, such as a surface relief diffraction grating, a volume Bragg diffraction grating, or any other suitable type of diffraction grating. Further, the diffraction grating may be continuously variable about its length or stepwise variable. In any case, light that is directed back to the laser depends, at least in part, on the characteristics of the diffraction grating.

As the tuned light or the light with the desired spectrum is again incident on the diffraction grating, a portion of the light will again be reflected back to the laser (320) while a portion will be transmitted. The transmitted light from each of the lasers (320) in the array (310) is then combined to form a beam of broad spectrum light. As introduced, these may include several relatively narrow spectra. For example, tens of relatively narrow bandwidths may be produced by the array. Further, each of the lasers produce the desired spectra substantially simultaneously. The light may then be combined as desired. For example, according to one exemplary embodiment, the light is combined using an integrator device, such as an integrating rod or integrating tunnel.

The combined light has a relatively short coherence length. The coherence length is defined as the wavelength of a light source squared divided by the bandwidth of light of the light source. Because the combined wavelength is distributed about a broad spectrum, the bandwidth of the light source is effectively the entire bandwidth of the broad spectrum. Thus, the combined beam has a relatively short coherence length. The relatively short coherence length provides an indication of the speckle reduction provided by the light source module (300).

This laser array could be fabricated on a single semiconductor chip due to the large gain bandwidth of semiconductor lasers. The actual operation wavelength of a semiconductor laser is determined by the optical gain in the semiconductor gain region and the optical feedback provided to the laser. By placing the semiconductor chip in an external cavity and using a grating or distributed feedback, a semiconductor laser can be made to lase over a very wide bandwidth. Thus if one took a laser bar with tens of individual lasers on it and used a chirped grating for feedback one could have the single laser bar emitting tens of different wavelengths. This laser bar would then have a broad optical spectrum that is similar in bandwidth to light emitting diodes and speckle would be reduced.

Method of Forming a Light Source Module

Figure 4:
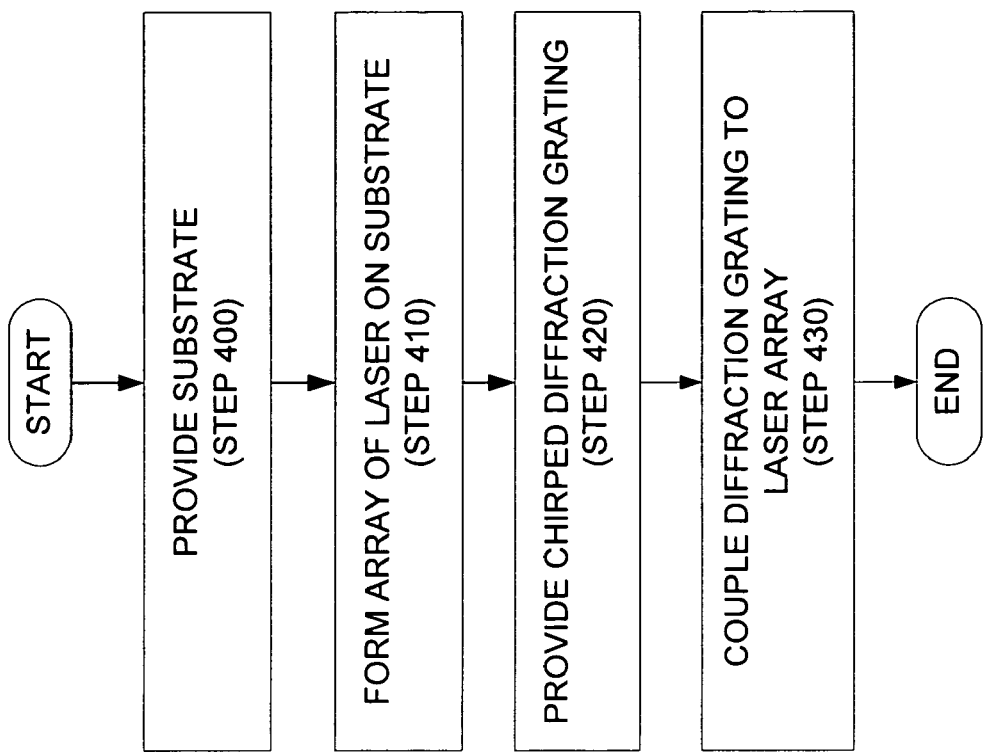
FIG. 4 illustrates a method of forming a light source module according to one exemplary embodiment.

FIG. 4 illustrates an exemplary method of forming a light source module. The method begins by providing a substrate (step 400). Any suitable substrate may be used, including, but not limited to semiconductor materials such as silicon, gallium arsenide, indium phosphide or other materials suitable for formation of optical devices and/or integrated circuits.

Thereafter, an array of lasers is formed on the substrate (step 410). For example, according to one exemplary method, an entire array of semiconductor lasers may be formed on the same substrate. Each of the lasers may be formed to produce a similar spectrum of light. For example, according to one exemplary method, all the lasers in the array may be edge emitting lasers with a similar wavelength. Such a configuration may provide for a relatively simple formation process as all the lasers may be similar. According to other exemplary methods, other types or combinations of lasers may be formed.

Thereafter, a chirped or variable diffraction grating is provided (step 420). According to one exemplary embodiment, providing the diffraction grating includes forming a surface relief diffraction grating with pitch of between about 100 to about 10000 nm. Further, the pitch may be formed to vary continuously or to vary stepwise. In addition, according to other exemplary methods, providing a chirped diffraction grating may include providing a Bragg volume diffraction grating. Providing a variable diffraction grating may include providing a unitary or monolithic type diffraction grating and/or providing several diffraction gratings which are then secured together.

In any case, once the variable diffraction grating is provided, the variable diffraction grating is coupled to the laser array (step 430). According to one exemplary embodiment, the diffraction grating is located at between about 0 and about 1000 mm from the laser array. Further, according to one exemplary method, the face of the diffraction grating may be substantially parallel to the face of the laser array or held at some angle.

A light source module is provided herein for use in display systems. According to one exemplary embodiment, the light source module (300) includes an array of lasers, such as an array of semiconductor lasers. According to one exemplary embodiment, the output of the array of lasers is tuned using a chirped or varied diffraction grating in optical communication with the laser array. The chirped grating provides differing feedback to each individual laser. By selecting the feedback provided to each laser, each laser may be tuned to produce a relatively narrow spectrum of light with a peak at a desired or tuned wavelength. The output of each laser in the array may be selected such that each relatively narrow spectrum may be combined to form broad spectrum light. For example, tens of spectra may be combined to form a single beam of broad spectrum light. Thus, the resulting combined output of the laser array is broad spectrum light with a short coherence length. The relatively short coherence length over the broad spectrum reduces speckle while providing a bright output. The laser array may be readily formed on a single chip or substrate, thereby reducing the complexity associated with forming a light source module.

The preceding description has been presented only to illustrate and describe the present method and apparatus. It is not intended to be exhaustive or to limit the disclosure to any precise form disclosed. Many modifications and variations are possible in light of the above teaching. It is intended that the scope of the disclosure be defined by the following claims.

What is claimed is:

1. A light source module for use in display systems, comprising:
    a first set of coherent light sources;
    a second set of coherent light sources; and
    a first diffraction grating in optical communication with said first set of coherent light sources, said first diffraction grating being configured to provide feedback to said coherent light sources of said first set to produce a plurality of spectra over a broad spectrum;
    a second diffraction grating in optical communication with said second set of coherent light sources, said second diffraction grating being configured to provide feedback to said coherent light sources of said second set to produce a plurality of spectra over a broad spectrum;

an integrating rod or tunnel, wherein tuned light from both said first and second set of coherent light sources is directed into said integrating rod or tunnel, which spatially homogenizes the light received; and an optical coupler for optically coupling spatially homogenized light from said integrating rod or tunnel with a said display system;

wherein said first and second diffraction gratings have differing characteristics that help produce said broad spectrum produced by said diffraction gratings and coherent light sources.

2. The light source module of claim 1, wherein said coherent light sources are semiconductor lasers.

3. The light source module of claim 2, wherein at least one of said semiconductor lasers is an edge emitting laser.

4. The light source module of claim 2, wherein at least one of said semiconductor lasers is a VCSEL laser.

5. The light source module of claim 1, wherein said diffraction gratings are surface relief diffraction gratings having indices from between about 100 to about 10,000 nm.

6. The light source module of claim 1, wherein each said diffraction grating is a monolithic diffraction grating.

7. A method of producing a display, comprising:
producing a plurality of coherent light beams with first and second sets of coherent light sources;

tuning coherent beams from said first set of light sources with a first diffraction grating to simultaneously produce different individual spectra covering a broad spectrum;

tuning coherent beams from said second set of light sources with a second diffraction grating to simultaneously produce different individual spectra adding to said broad spectrum because said second diffraction grating has different characteristics than said first diffraction grating;

integrating said plurality of coherent beams with an integrating tunnel or rod, after said tuning, into a light beam having said broad spectrum comprised of said different individual spectra; and optically coupling said light beam having said broad spectrum with a display system comprising a light modulator.

8. The method of claim 7, wherein tuning said plurality of coherent beams includes directing said light to a chirped diffraction grating.

9. The method of claim 7, wherein producing said plurality of coherent beams includes producing a plurality of laser beams.

10. The method of claim 7, wherein each of said coherent beams has a spectrum of less than about 1 nm.

11. The method of claim 10, wherein said broad spectrum has a width of greater than about 30 nm.

12. The light source module of claim 1, wherein at least one of said diffraction gratings is a surface relief diffraction grating.

13. The method of claim 7, wherein at least one of said diffraction gratings is a surface relief diffraction grating.

* * * * *